United States Patent
Sirajudeen et al.

(10) Patent No.: US 10,566,037 B1
(45) Date of Patent: Feb. 18, 2020

(54) AUTOMATED VOLTAGE AND TIMING MARGIN MEASUREMENT FOR NAND FLASH INTERFACE

(71) Applicant: Western Digital Technologies, Inc., San Jose, CA (US)

(72) Inventors: Shajith Musaliar Sirajudeen, Karnataka (IN); Taninder Sijher, Karnataka (IN)

(73) Assignee: WESTERN DIGITAL TECHNOLOGIES, INC, San Jose, CA (US)

( * ) Notice: Subject to any disclaimer, the term of this patent is extended or adjusted under 35 U.S.C. 154(b) by 0 days.

(21) Appl. No.: 16/047,953

(22) Filed: Jul. 27, 2018

(51) Int. Cl.
G11C 7/22 (2006.01)
G11C 7/10 (2006.01)

(52) U.S. Cl.
CPC .............. *G11C 7/22* (2013.01); *G11C 7/1096* (2013.01); *G11C 2207/229* (2013.01)

(58) Field of Classification Search
CPC ................................ G11C 7/22; G11C 7/1096
USPC ......................................................... 365/194
See application file for complete search history.

(56) References Cited

U.S. PATENT DOCUMENTS

| | | | |
|---|---|---|---|
| 8,897,084 B2 * | 11/2014 | Chen .................. | G06F 13/1689 365/191 |
| 8,923,442 B2 * | 12/2014 | Chandrasekaran ... | H04L 25/063 375/224 |
| 9,087,567 B2 * | 7/2015 | Yildirim .................. | G11C 8/06 |
| 9,432,179 B2 * | 8/2016 | Stott ..................... | G11C 7/1051 |
| 9,672,882 B1 * | 6/2017 | Jeter ..................... | G11C 7/1066 |
| 9,996,486 B2 | 6/2018 | Zehavi et al. | |
| 10,198,383 B2 | 2/2019 | Zehavi et al. | |
| 2012/0063524 A1* | 3/2012 | Stott ..................... | G11C 7/1051 375/259 |
| 2012/0140583 A1* | 6/2012 | Chung .................. | G11C 7/109 365/191 |
| 2013/0064025 A1* | 3/2013 | Chen ................... | G06F 13/1689 365/193 |
| 2013/0202061 A1* | 8/2013 | Chandrasekaran ..... | H04L 25/06 375/317 |
| 2015/0092510 A1* | 4/2015 | Yildirim ................. | G11C 8/06 365/233.13 |
| 2016/0035411 A1* | 2/2016 | Yu ........................ | G11C 11/4091 365/189.07 |
| 2019/0056880 A1 | 2/2019 | Tzafrir et al. | |
| 2019/0058474 A1 | 2/2019 | Tzafrir et al. | |

* cited by examiner

*Primary Examiner* — Xiaochun L Chen
(74) *Attorney, Agent, or Firm* — Patterson & Sheridan, LLP; Steven H. Versteeg (57) ABSTRACT

A storage device comprises a controller, such as an ASIC controller, and one or more NAND flash memory devices. The controller comprises a differential receiver and a delay locked loop circuit. During read and write operations, the controller is configured to vary a delay of a data strobe signal by an interval across a width of a data window using the delay locked loop circuit, and to compare a write pattern to a read pattern for each delayed interval to determine the timing margins of the storage device. During read and write operations, the controller is further configured to apply a reference voltage to a host interface or a memory interface, increment and decrement the reference voltage by a set value, and compare a write pattern to a read pattern for each varied reference voltage value to determine the voltage margins of the storage device.

30 Claims, 7 Drawing Sheets

AUTOMATED VOLTAGE AND TIMING MARGIN MEASUREMENT FOR NAND FLASH INTERFACE

BACKGROUND OF THE DISCLOSURE

Field of the Disclosure

Embodiments of the present disclosure generally relate to data storage devices using NAND flash, and more specifically to solid state drives (SSDs), Secure Digital (SD) cards, micro Secure Digital (micro-SD) cards, and CFexpress cards.

Description of the Related Art

During operation of a data storage device, data may be communicated between a controller and a memory device of the data storage device via a memory interface that couples the controller and the memory device. The controller may then communicate the data to a host device via a host interface that couples the controller and the host. The controller may communicate data to and from the memory device and host device at various speeds. Measuring voltage and timing margins for such communications can be difficult due to the compact nature of the data storage devices.

One approach is to physically connect a probe to the data storage device to measure the timing and voltage margins using test points on the interfaces. Such an approach is executed by a user or by engineers in a lab, which makes the approach inconvenient and time consuming. Additionally, as the speed of read and write operations increase, the presence of the test points on the interfaces can cause signal integrity issues, negatively impacting the margins and potentially resulting in read and write failures.

Therefore, what is needed is an improved method for measuring timing and voltage margins of a data storage system.

SUMMARY OF THE DISCLOSURE

A storage device comprises a controller, such as an ASIC controller, and one or more NAND flash memory devices. The controller comprises a differential receiver and a delay locked loop circuit. During read and write operations, the controller is configured to vary a delay of a data strobe signal by an interval across a width of a data window using the delay locked loop circuit, and to compare a write pattern to a read pattern for each delayed interval to determine the timing margins of the storage device. During read and write operations, the controller is further configured to apply a reference voltage to a host interface or a memory interface, increment and decrement the reference voltage by a set value, and compare a write pattern to a read pattern for each varied reference voltage value to determine the voltage margins of the storage device.

In one embodiment, a method for measuring timing margins of a storage device during a write operation comprises varying a delay of a data strobe signal by an interval across a width of a data window using a delay locked loop circuit, wherein the interval is less than a width of the data window, and determining one or more valid timing margins based on each varied interval of the delayed data strobe.

In one embodiment, a data storage device comprises one or more memory devices and a controller coupled to the one or more memory devices. The controller is configured to align a data strobe signal with an edge of a data window, delay the data strobe signal by one or more intervals along the data window using a delay locked loop circuit, and quantify one or more timing margins of the data window based on the delay of the data strobe signal.

In another embodiment, a data storage device comprises one or more flash memory devices, a memory interface coupled to the one or more flash memory devices, and a controller coupled to the memory interface and to the one or more flash memory devices. The controller is configured to apply a reference voltage to the memory interface at an initial value. The controller is further configured to determine a first margin of the reference voltage by incrementing the initial value of the reference voltage by a first voltage amount, and determine a second margin of the reference voltage by resetting the reference voltage to the initial value and decrementing the reference voltage by a second voltage amount.

In one embodiment, a method for measuring a voltage margin of a data storage device during a read operation comprises applying a reference voltage to a host interface of the data storage device at an initial value and determining a first margin of the reference voltage. The determining of a first margin comprises incrementing the reference voltage at the host interface one or more times by a first voltage amount, comparing a write pattern to a read pattern, and recording the first margin of the reference voltage when the write pattern does not equal the read pattern. The method further comprises determining a second margin of the reference voltage. The determining of the second margin comprises resetting the reference voltage to the initial value, decrementing the reference voltage at the host interface one or more times by a second voltage amount, comparing a write pattern to a read pattern, and recording the second margin of the reference voltage when the write pattern does not equal the read pattern.

In another embodiment, a storage device comprises one or more memory devices, means for varying a delay of a data strobe signal across a plurality of intervals of a data window, means for determining one or more timing margins, and means for determining one or more voltage margins.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following, reference is made to embodiments of the disclosure. However, it should be understood that the disclosure is not limited to specific described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

A storage device comprises a controller, such as an ASIC controller, and one or more NAND flash memory devices. The controller comprises a differential receiver and a delay locked loop circuit. During read and write operations, the controller is configured to vary a delay of a data strobe signal by an interval across a width of a data window using the delay locked loop circuit, and to compare a write pattern to a read pattern for each delayed interval to determine the timing margins of the storage device. During read and write operations, the controller is further configured to apply a reference voltage to a host interface or a memory interface, increment and decrement the reference voltage by a set value, and compare a write pattern to a read pattern for each varied reference voltage value to determine the voltage margins of the storage device.

Figure 1:
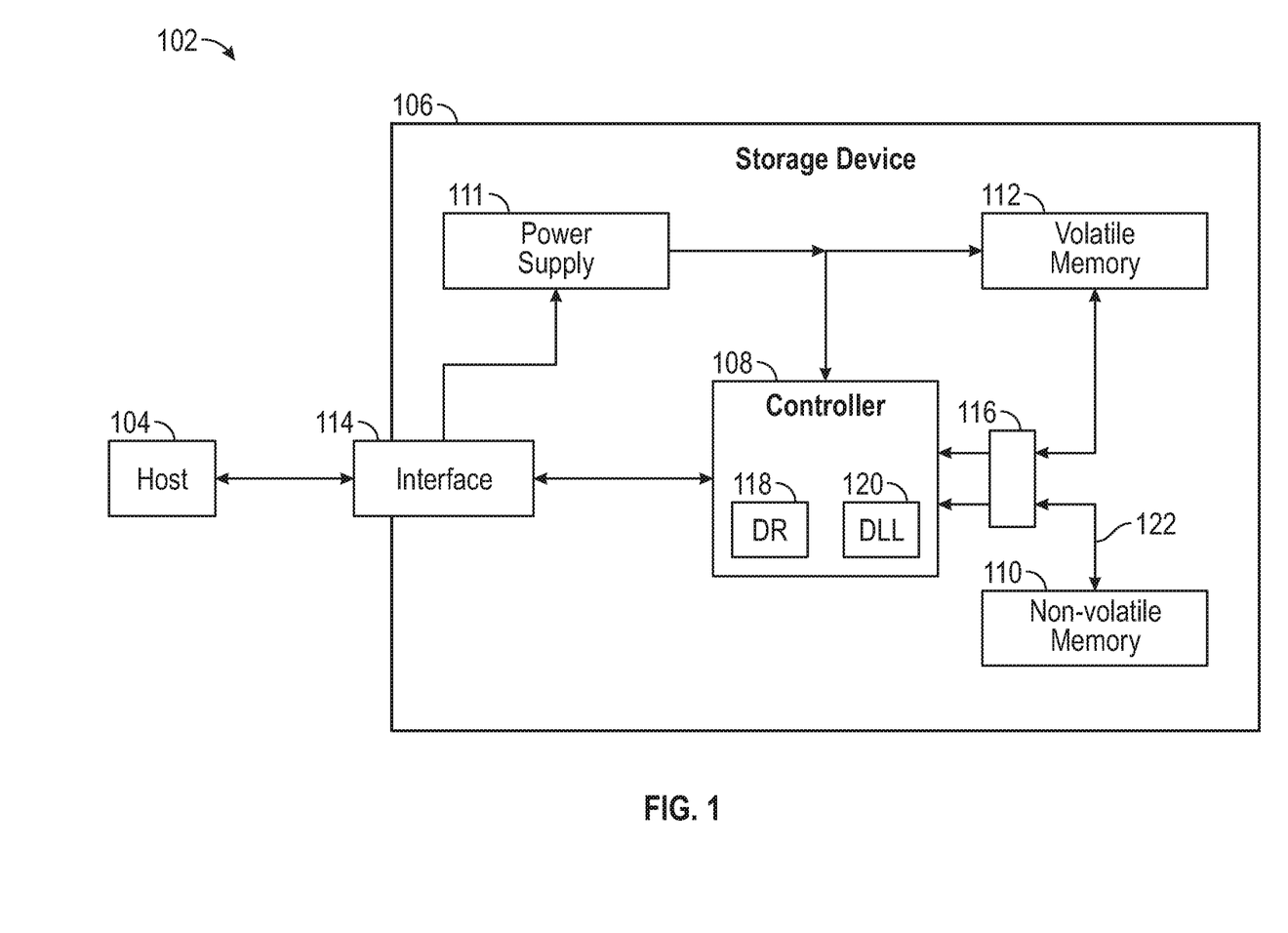
FIG. 1 is a conceptual and schematic block diagram illustrating a storage system, according to one embodiment.

FIG. 1 is a conceptual and schematic block diagram illustrating a storage system 102 in which storage device 106 may function as a storage device for host device 104, in accordance with one or more techniques of this disclosure. For instance, host device 104 may utilize non-volatile memory devices included in storage device 106 to store and retrieve data. In some examples, storage system 102 may include a plurality of storage devices, such as storage device 106, which may operate as a storage array. For instance, storage system 102 may include a plurality of storages devices 106 configured as a redundant array of inexpensive/independent disks (RAID) that collectively function as a mass storage device for host device 104.

Storage system 102 includes host device 104 which may store and/or retrieve data to and/or from one or more storage devices, such as storage device 106. As illustrated in FIG. 1, host device 104 may communicate with storage device 106 via a host interface 114. Host device 104 may comprise any of a wide range of devices, including computer servers, network attached storage (NAS) units, desktop computers, notebook (i.e., laptop) computers, tablet computers, set-top boxes, telephone handsets such as so-called "smart" phones, so-called "smart" pads, televisions, cameras, display devices, digital media players, video gaming consoles, video streaming device, and the like.

As illustrated in FIG. 1, storage device 106 may include controller 108, non-volatile memory 110 (NVM 110), power supply 111, volatile memory 112, host interface 114, memory interface 116, and one or more data lines 122. In some examples, storage device 106 may include additional components not shown in FIG. 1 for sake of clarity. For example, storage device 106 may include a printed board (PB) to which components of storage device 106 are mechanically attached and which includes electrically conductive traces that electrically interconnect components of storage device 106, or the like. In some examples, the physical dimensions and connector configurations of storage device 106 may conform to one or more standard form factors. Some example standard form factors include, but are not limited to, 2.5" data storage device (e.g., an HDD or SSD), 2.5" data storage device, 1.8" data storage device, peripheral component interconnect (PCI), PCI-extended (PCI-X), PCI Express (PCIe) (e.g., PCIe x1, x4, x8, x16, PCIe Mini Card, MiniPCI, etc.). In some examples, storage device 106 may be directly coupled (e.g., directly soldered) to a motherboard of host device 104.

Storage device 106 includes a host interface 114 for interfacing with host device 104. Host interface 114 may include one or both of a data bus for exchanging data with host device 104 and a control bus for exchanging commands with host device 104. Host interface 114 may operate in accordance with any suitable protocol. For example, host interface 114 may operate in accordance with one or more of the following protocols: advanced technology attachment (ATA) (e.g., serial-ATA (SATA) and parallel-ATA (PATA)), Fibre Channel Protocol (FCP), small computer system interface (SCSI), serially attached SCSI (SAS), PCI, and PCIe, non-volatile memory express (NVMe), or the like. The electrical connection of host interface 114 (e.g., the data bus, the control bus, or both) is electrically connected to controller 108, providing electrical connection between host device 104 and controller 108, allowing data to be exchanged between host device 104 and controller 108. In some examples, the electrical connection of host interface 114 may also permit storage device 106 to receive power from host device 104. For example, as illustrated in FIG. 1, power supply 111 may receive power from host device 104 via the host interface 114.

Storage device 106 further comprises a memory interface 116 coupled to the controller 108. The memory interface 116 communicatively couples the controller 108 to one or more memory devices, such as NVM 110 and/or volatile memory 112, via one or more data lines or signals 122. The memory interface 116 may include one or more bus drivers to send data and commands to the NVM 110. NVM 110 may be configured to store and/or retrieve data. For instance, a memory device of NVM 110 may receive data and a message from controller 108 via the memory interface 116 that instructs the memory device to store the data or to retrieve data. In some examples, each of the memory devices may be referred to as a die. In some examples, a single physical chip may include a plurality of dies (i.e., a plurality of memory devices). In some examples, each memory devices may be configured to store relatively large amounts of data (e.g., 128 MB, 256 MB, 512 MB, 1 GB, 2 GB, 4 GB, 8 GB, 16 GB, 22 GB, 64 GB, 128 GB, 256 GB, 512 GB, 1 TB, etc.).

In some examples, each memory device of NVM 110 may include any type of non-volatile memory devices, such as flash memory devices, phase-change memory (PCM)

devices, resistive random-access memory (ReRAM) devices, magnetoresistive random-access memory (MRAM) devices, ferroelectric random-access memory (F-RAM), holographic memory devices, and any other type of non-volatile memory devices.

Flash memory devices may include NAND or NOR based flash memory devices, and may store data based on a charge contained in a floating gate of a transistor for each flash memory cell. In NAND flash memory devices, the flash memory device may be divided into a plurality of blocks which may divided into a plurality of pages. Each block of the plurality of blocks within a particular memory device may include a plurality of NAND cells. Rows of NAND cells may be electrically connected using a word line to define a page of a plurality of pages. Respective cells in each of the plurality of pages may be electrically connected to respective bit lines.

The controller 108 may write data to and read data from NAND flash memory devices at the page level and erase data from NAND flash memory devices at the block level. The controller 108 may manage one or more operations of storage device 106. For instance, the controller 108 may manage the reading of data from and/or the writing of data to the NVM 110. The controller 108 may be configured to receive data or commands from the host device 104 via the host interface 114. For example, the controller 108 may send a read command to the NVM 110 in response to receiving a request for read access from the host device 104. The controller 108 may sent a read command to the NVM 110, and may determine a read pattern or value after reading data from the NVM 110.

The controller 108 may cause the memory interface 116 to send data and a write command to the NVM 110 via the one or more data lines 122. The write command may specify one or more physical addresses of the NVM 110, such as a physical address of a memory block. Upon receiving the data, the NVM 110 may cause the read/write circuitry to program the data to the NAND flash memory devices. After the NVM 110 writes data in response to a received command, a write pattern or value of the controller 108 may be determined.

Storage device 106 includes power supply 111, which may provide power to one or more components of storage device 106. When operating in a standard mode, power supply 111 may provide power to the one or more components using power provided by an external device, such as host device 104. For instance, power supply 111 may provide power to the one or more components using power received from host device 104 via host interface 114. In some examples, power supply 111 may include one or more power storage components configured to provide power to the one or more components when operating in a shutdown mode, such as where power ceases to be received from the external device. In this way, power supply 111 may function as an onboard backup power source. Some examples of the one or more power storage components include, but are not limited to, capacitors, super capacitors, batteries, and the like. In some examples, the amount of power that may be stored by the one or more power storage components may be a function of the cost and/or the size (e.g., area/volume) of the one or more power storage components. In other words, as the amount of power stored by the one or more power storage components increases, the cost and/or the size of the one or more power storage components also increases.

Storage device 106 also includes volatile memory 112, which may be used by controller 108 to store information. In some examples, controller 108 may use volatile memory 112 as a cache. For instance, controller 108 may store cached information in volatile memory 112 until cached information is written to non-volatile memory 110. As illustrated in FIG. 1, volatile memory 112 may consume power received from power supply 111. Examples of volatile memory 112 include, but are not limited to, random-access memory (RAM), dynamic random access memory (DRAM), static RAM (SRAM), and synchronous dynamic RAM (SDRAM (e.g., DDR1, DDR2, DDR2, DDR2L, LPDDR2, DDR4, and the like)).

In at least one implementation, the controller 108 comprises application specific integrated circuits (ASICs). The controller 108 includes a differential receiver (DR) 118 and a delay locked loop circuit (DLL) 120. The controller 108 is configured to receive a plurality of data strobe signals and data signals, and is configured to align the signals along a data window. The data strobe signals may be read data strobe signals received from the NAND flash memory devices. The data window may be defined by a data output or a read data output received from the NAND flash memory devices. The controller 108 may use the differential receiver 118 to measure the voltage margins during read and write operations, and may use the DLL 120 to measure the timing margins during read and write operations. Using the differential receiver 118 and the DLL 120 permits the measuring of voltage and timing margins to be automated measurements implemented into the firmware of the storage device 106.

Figure 2A:
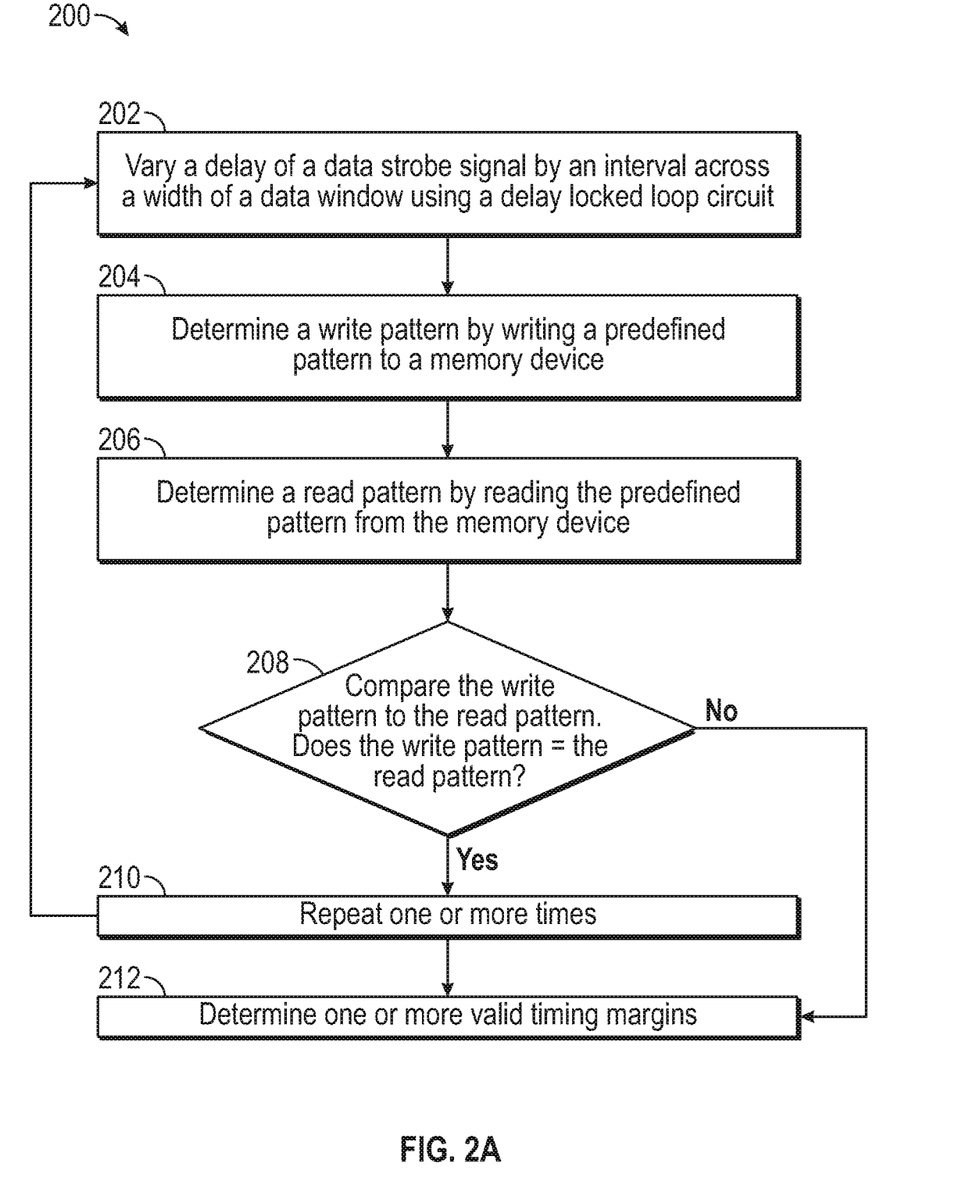
FIGS. 2A-2B illustrate methods for measuring timing margins of a data storage device during write and read operations, according to one embodiment.
Figure 2B:
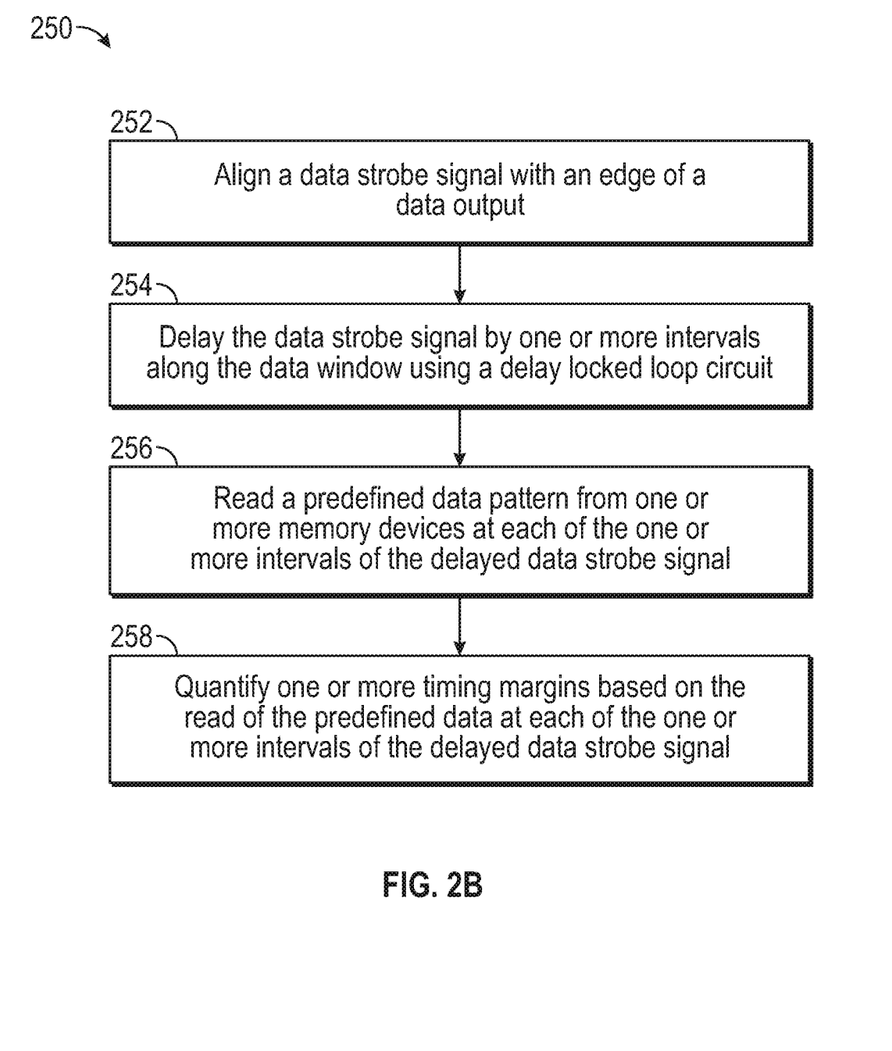

FIG. 2A illustrates a method 200 for measuring timing margins of a data storage device during a write operation, according to one embodiment. FIG. 2B illustrates a method 250 for measuring timing margins of a data storage device during a read operation, according to another embodiment. The methods 200 and 250 may be used with the data storage system 100 of FIG. 1. In one embodiment, the methods 200 and 250 are implemented using an ASIC controller. The methods 200 and 250 may be automated methods implemented into the firmware of the data storage device.

Figure 3A:
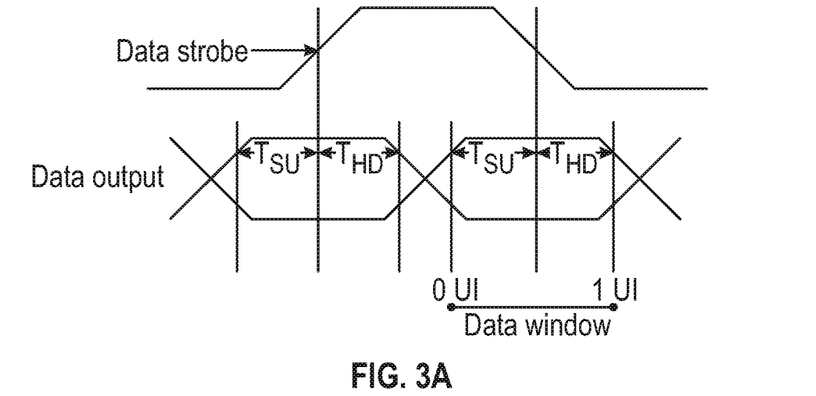
FIGS. 3A-3C illustrate a data strobe signal being varied with respect to a data output window, according to another embodiment.
Figure 3B:
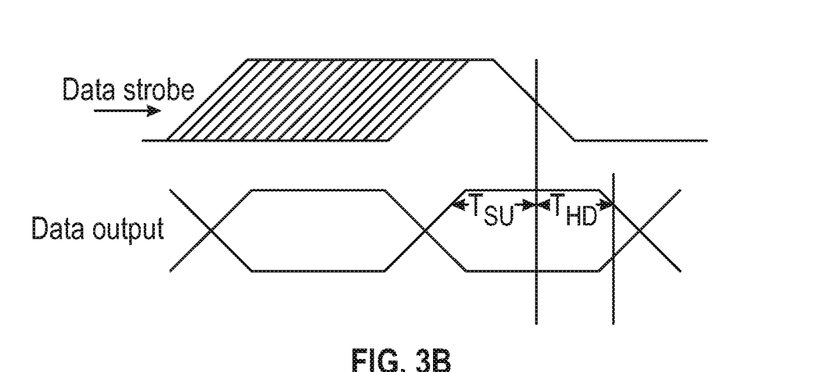
Figure 3C:
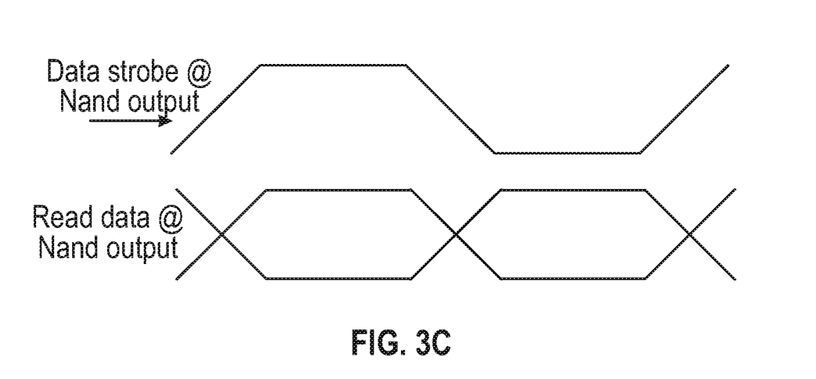

In operation 202 of method 200, a data strobe signal is initially aligned with a data window, and the data strobe signal is varied by an interval across a width of the data window using a DLL. FIG. 3A illustrates a data strobe signal being aligned with the center of a data window. FIG. 3B demonstrates a data strobe signal being varied by an interval across the width of a data window. FIG. 3C illustrates a data strobe being aligned at an edge of a data window. The DLL may be the DLL 120 of FIG. 1. The interval is less than the width of the data window. In at least one implementation, the interval is 0.1 UI, or $\frac{1}{10}^{th}$ of the width of the data window. In one embodiment, the data window has a width spanning 0 unit intervals (UI) to 1 UI, and the data strobe signal is initially aligned at 0 UI. In another embodiment, the data strobe signal is aligned outside the data window, as shown in FIG. 3C. In yet another embodiment, the data strobe signal is initially aligned at 0.5 UI, as shown in FIG. 3A.

In operation 204, a write pattern is determined by writing a predefined pattern to a memory device of the data storage device. The memory device may be a NAND flash memory device, and may be a memory device of the NVM 110 of FIG. 1. In operation 206, a read pattern is determined by reading the predefined pattern from the memory device. In one embodiment, writing the predefined pattern occurs at a first speed, and reading the predefined pattern occurs at a second speed. In one embodiment, the second speed is greater than the first speed. The second speed may be equal to a product power on reset data rate speed. The first speed may be the lowest writing speed the data storage device is capable of writing at.

In operation 208, the write pattern is compared to the read pattern. If the write pattern matches the read pattern, the method 200 proceeds to operation 210. If the write pattern does not match the read pattern, the method 200 may proceed to either operation 210 or operation 212. Operation 210 restarts the method 200 to repeat operations 202, 204, 206, and 208 one or more times. Each time operation 202 is repeated, the data strobe signal is varied by another interval. In one embodiment, the varying of the data strobe signal comprises incrementing the data strobe signal by an interval of the data window one or more times, and decrementing the data strobe signal by an interval of the data window one or more times, such as when the data strobe signal is initially aligned with the center of the data window. In another embodiment, the varying of the data strobe signal comprises starting at an initial interval at the beginning of the width of the data window and incrementing the data strobe signal by the interval until reaching the last interval of the width of the data window such that the data strobe signal is delayed across the entire width of the data window. The write pattern and the read pattern are then determined for each delay of the data strobe signal. In one embodiment, the voltage, temperature, and process conditions of the storage device are altered in operation 210 before restarting at operation 202.

In one embodiment, operation 210 restarts the method 200 to repeat operations 202-208 until the write pattern is determined to be not equal to the read pattern. For example, if the data strobe signal is initially aligned with the center of the data window, as shown in FIG. 3A, operations 202-208 may be repeated one or more times until the write pattern is determined to be not equal to the read pattern. In another embodiment, operation 210 restarts the method 200 to repeat operations 202-208 until the delay of the data strobe signal has been varied across the entire width of the data window. For example, if the data window has a width of 0 UI to 1 UI and the interval equals 0.1 UI, operations 202-208 will be repeated at least 10 times to determine whether the write pattern matches the read pattern at each interval. If the data strobe signal is initially aligned at the edge of the data window, as shown in FIG. 3B, operations 202-208 may be repeated one or more times even if the write pattern is determined to be not equal to the read pattern, and operation 208 may proceed to operation 210.

After operations 202-208 have been repeated one or more times to determine whether the write pattern matches the read pattern for the varied intervals, the method 200 determines one or more valid timing margins for the data storage device in operation 212. In one embodiment, if the write pattern does not equal the read pattern in operation 208, the method 200 proceeds to operation 212 without proceeding to operation 210, such as when the data strobe signal is initially aligned with the center of the data window. A valid timing margin occurs at each varied interval of the delay of the data strobe signal where the write pattern was determined to equal the read pattern.

FIG. 2B illustrates a method 250 for measuring timing margins of a data storage device during a read operation, according to another embodiment.

In operation 252 of method 250, a data strobe signal is aligned with an edge of a data output. The data strobe signal may be aligned outside the data window, as shown in FIG. 3C. The data strobe signal may be at the NAND output, and the data output may be the read data at the NAND output. The data output defines a data window. In one embodiment, the data window has a width of 0 unit intervals (UI) to 1 UI.

In operation 254, the data strobe signal is delayed by one or more intervals along the data window using a DLL. The interval may be 0.1 UI, or $1/10^{th}$ of the width of the data window. In one embodiment, the DLL is present in the path of the data strobe signal, and adds a delay to the data strobe signal from the NAND. The DLL being present in the path of the data strobe signal may output a DLL value, and permits the DLL to align the data strobe signal at an optimal location with respect to the data window, resulting in better setup and hold margins.

In operation 256, a controller of the data storage reads a predefined data pattern from one or more memory devices at each of the one or more intervals of the delayed data strobe signal. The one or more memory devices may be NAND flash memory devices. In one embodiment, the controller reads the predefined data pattern at 10 or more intervals across the data window.

In operation 258, one or more timing margins are quantified based on the read of the predefined data at each of the one or more intervals of the delayed data strobe signal. In one embodiment, the timing margins are quantified by tracking the passing DLL value in the path of the data strobe signal, giving the data in the data window valid margins.

By utilizing the automated methods 200 and 250, the timing margins of the data storage device may be measured without physical intervention from a user during read and write operations. The automated methods 200 and 250 can align the data strobe signal in an optimum location for better setup and hold margins, and can reduce the time required to measure the timing margins.

FIGS. 3A-3C illustrate a data strobe signal being varied with respect to a data output window. FIG. 3A illustrates a data strobe signal aligned at the center of the data output window. The DLL may align the data strobe signal. In one embodiment, the data window has a width of 0 UI to 1 UI, and the data strobe signal is aligned at 0.5 UI. In such an embodiment, 0 UI to 0.5 UI illustrates the data setup time ($T_{SU}$) while 0.5 UI to 1 UI illustrates the data hold time ($T_{HD}$).

FIG. 3B demonstrates a data strobe signal being varied across the data window using a DLL. The data strobe signal is incremented and/or decremented at set intervals with respect to the data window. In one embodiment, each interval is 0.1 UI. FIG. 3B illustrates operation 202 in method 200.

FIG. 3C demonstrates aligning the data strobe signal at the edge of the data output, such as is done in operation 252 of method 250. By aligning the data strobe signal at the edge of the data output, the DLL can delay the data strobe signal to be aligned at an optimum location with respect to the data window for achieve better setup and hold margins.

Figure 4A:
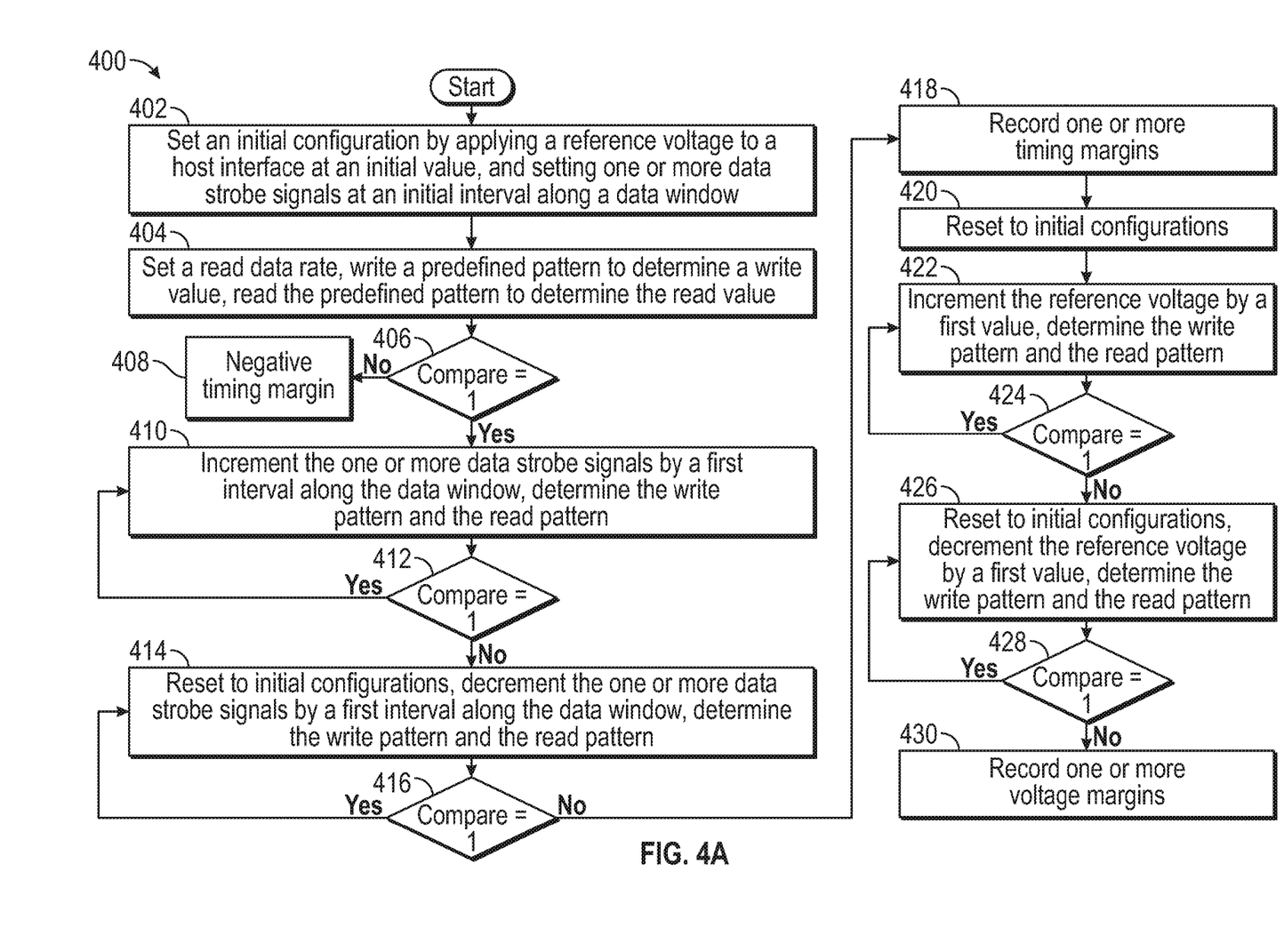
FIGS. 4A-4B illustrate methods of measuring the voltage margins of a data storage device during write and read operations, according to one embodiment.
Figure 4B:
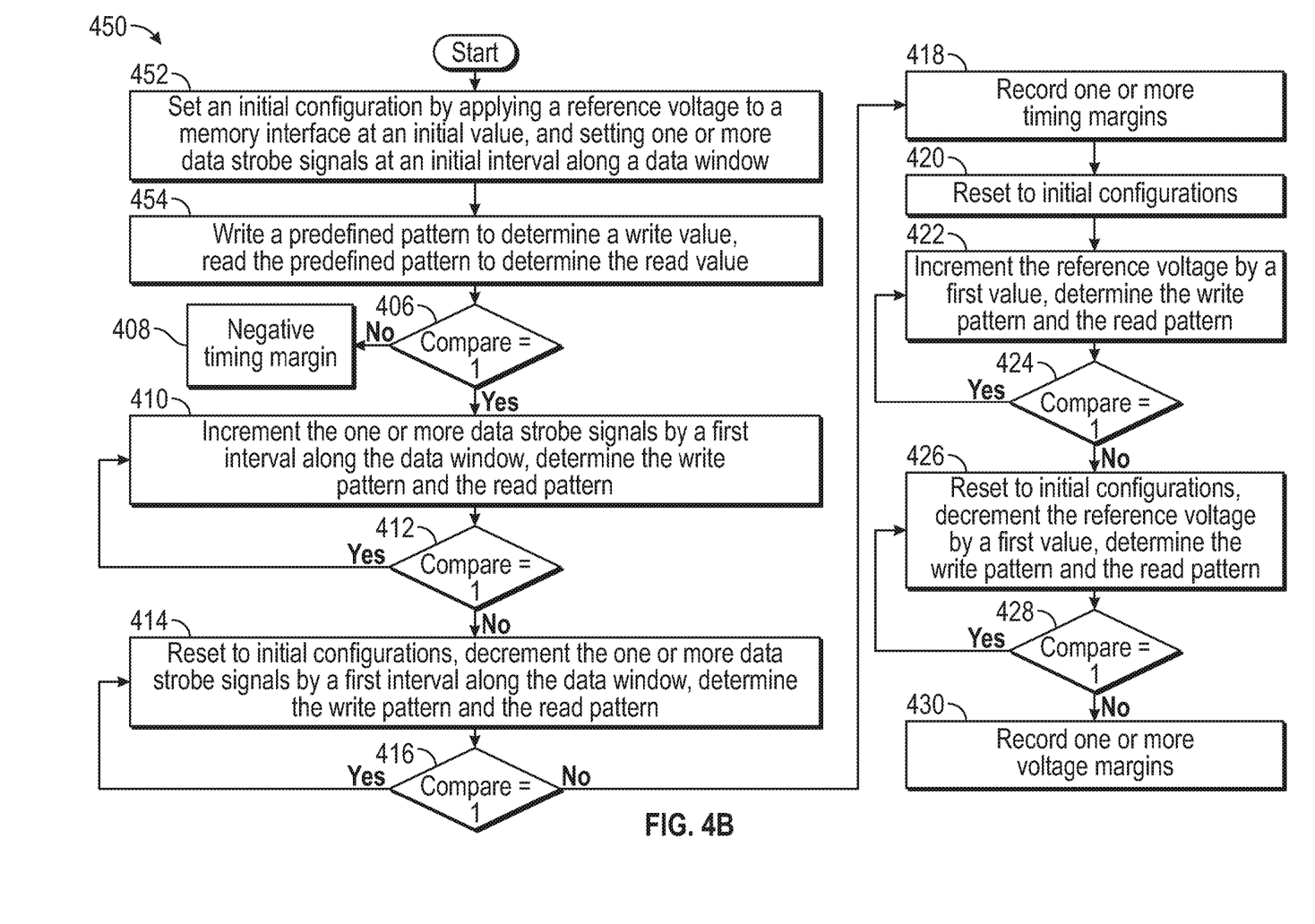
Figure 4C:
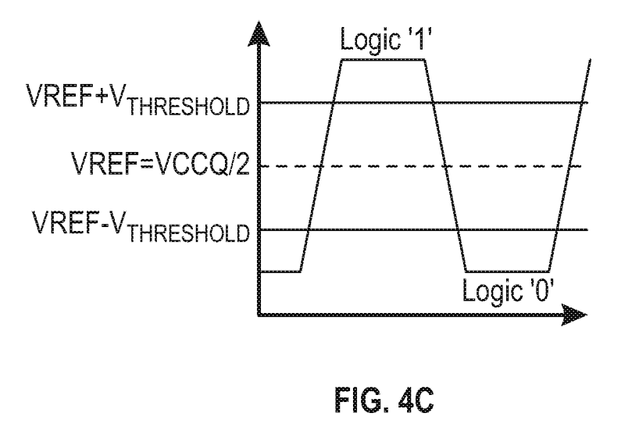
FIG. 4C illustrates a graph representing valid voltage margins, according to one embodiment.

FIGS. 4A-4B illustrate methods of measuring voltage margins of a data storage device. FIG. 4A illustrates a method 400 of measuring the voltage margins during a read operation. FIG. 4B illustrates a method 450 of measuring the voltage margins during a write operation. FIG. 4C illustrates a graph depicting the valid voltage margins. Methods 400 and 450 further illustrate a method of measuring one or more timing margins, according to one embodiment. The methods 400 and 450 may be used with the data storage system 100 of FIG. 1. In one embodiment, the methods 400 and 450 are implemented using an ASIC controller, such as the controller 108 of FIG. 1. The methods 400 and 450 may be automated methods implemented into the firmware of the data storage device.

In operation 402 of method 400 of FIG. 4A, the data storage device is set to an initial configuration. The initial configuration includes applying a reference voltage to a host interface of the data storage device at an initial value and setting one or more data strobe signals at an initial interval along a data window. The host interface may be the host interface 114 of FIG. 1. The initial value of the reference voltage may be set to one half of a supply voltage or input/output voltage. In one embodiment, the data window has a width of 0 UI to 1 UI, and the initial interval of the one or more data strobe signals is 0.5 UI, as shown in FIG. 3A.

In operation 404 of method 400, a read data rate is set to a first speed, and the controller of the data storage device writes a predefined pattern to a memory device to determine a write pattern at a second speed. The controller then reads the predefined pattern from the memory device to determine a read pattern at the first speed. The first speed may be faster than the second speed. The first speed may be a maximum power speed, such as a product power on reset data rate. The second speed may be the lowest writing speed at which the data storage device is capable of writing. In at least one implementation, the memory device is a NAND flash memory device, such as a memory device of the NVM 110 of FIG. 1.

Similarly, in operation 452 of method 450 of FIG. 4B, the data storage device is set to an initial configuration. The initial configuration includes applying a reference voltage to a memory interface of the data storage device at an initial value and setting one or more data strobe signals at an initial interval along a data window. The memory interface may be the memory interface 116 of FIG. 1. The initial value of the reference voltage may be set to one half of a supply voltage or input/output voltage. In one embodiment, the data window has a width of 0 UI to 1 UI, and the initial interval of the one or more data strobe signals is 0.5 UI, as shown in FIG. 3A.

In operation 454 of method 450, the controller of the data storage device writes a predefined pattern to a memory device to determine a write pattern at a first speed. The controller then reads the predefined pattern from the memory device to determine a read pattern at a second speed. The first speed and the second speed may be the same. In one embodiment, the first speed and the second speed are a product power on reset data rate. In at least one implementation, the memory device is a NAND flash memory device.

In methods 400 and 450, operations 406-430 are the same. However, method 400 and method 450 maintain their respective write and read speeds configured in operations 404 and 454. Methods 400 and 450 further maintain applying the reference voltage to their respective interfaces such that the reference voltage is applied through the host interface in method 400 and the reference voltage is applied through the memory interface in method 450.

Following operation 404 and operation 454, both methods 400 and 450 proceed to operation 406. In operation 406, the write pattern is compared to the read pattern. If the write pattern is determined to equal the read pattern, method 400 and method 450 proceed to operation 410. If the write pattern is determined to be not equal to the read pattern, the methods 400 and 450 proceed to operation 408. In operation 408, the system determines that the timing margins are presently negative values.

In operation 410 of method 400 and 450, the data storage device increments the one or more data strobe signals by a first interval along the data window, and determines the write pattern and the read pattern. In one embodiment, the first interval is $1/10^{th}$ of the data window. In another embodiment, the first interval is 0.1 UI of the data window.

In operation 412, the write pattern is compared to the read pattern. If the write pattern matches the read pattern, the methods 400 and 450 return to operation 410 and increment the one or more data strobe signals by another interval. Each time the interval is incremented, the data storage system determines a write pattern and a read pattern for the particular data strobe signal setting, and compares the write pattern to the read pattern. Operations 410 and 412 may repeat one or more times until the read pattern is determined to be not equal to the write pattern. The write pattern and the read pattern not being equal indicates the first timing margin. Thus, the preceding interval where the read pattern did match the write pattern, or the penultimate interval, is the first margin. When the write pattern is determined to not equal the read pattern, the methods 400 and 450 proceed to operation 414.

In operation 414, the data storage device resets the one or more data strobe signals to the initial increment along the data window, decrements the one or more data strobe signals by a second interval along the data window, and determines the write pattern and the read pattern. The second interval may be the same as the first interval. In one embodiment, the second interval is $1/10^{th}$ of the data window. In another embodiment, the second interval is 0.1 UI of the data window.

In operation 416, the write pattern is compared to the read pattern. If the write pattern matches the read pattern, the methods 400 and 450 return to operation 414 and decrement the one or more data strobe signals by another interval. Each time the interval is decremented, the data storage system determines a write pattern and a read pattern for the particular data strobe signal setting, and compares the write pattern to the read pattern. Operations 414 and 416 may repeat one or more times until the read pattern is determined to be not equal to the write pattern. The write pattern and the read pattern not being equal indicates the second timing margin. Thus, the preceding interval where the read pattern did match the write pattern, or the penultimate interval, is the second margin. When the write pattern is determined to not equal the read pattern, the methods 400 and 450 proceed to operation 418.

In operation 418, the first and second timing margins of the data storage device are recorded.

In operation 420, the data storage device is reset to the initial configurations. For example, method 400 is reset to the configurations of operation 402 of applying a reference voltage to a host interface at an initial value and setting one or more data strobe signals at an initial interval along the data window, and method 450 is reset to the configurations of 452 of applying a reference voltage to a memory interface at an initial value and setting one or more data strobe signals at an initial interval along the data window.

In operation 422, the reference voltage is incremented by a first value, and a write pattern and a read pattern are determined. In one embodiment, the first value is 50 mV. The data storage system may utilize a differential receiver to increment the reference voltage. In operation 424, the write pattern is compared to the read pattern. If the write pattern matches the read pattern, the methods 400 and 450 return to operation 422 and increment the reference voltage another value. Each time the voltage value is incremented, the data storage system determines a write pattern and a read pattern for the particular reference voltage setting, and compares the write pattern to the read pattern. Operations 422 and 424 may repeat one or more times until the read pattern is determined to be not equal to the write pattern. The write pattern and the read pattern not being equal indicates the first voltage margin. Thus, the preceding voltage value where the read pattern did match the write pattern, or the penultimate voltage value, is the first voltage margin. The first voltage margin may be the upper voltage limit. When the write pattern is determined to not equal the read pattern, the methods 400 and 450 proceed to operation 426.

In operation 426, the data storage device resets the reference voltage to the initial value, decrements the reference voltage by a second value, and determines the write pattern and the read pattern. The second value may be the same as the first value, and may be 50 mV. The data storage system may utilize a differential receiver to decrement the reference voltage.

In operation 428, the write value is compared to the read value. If the write pattern matches the read pattern, the methods 400 and 450 return to operation 426 and decrements the reference voltage by another value. Each time the voltage value is decremented, the data storage system determines a write pattern and a read pattern for the particular reference voltage setting, and compares the write pattern to the read pattern. Operations 426 and 428 may repeat one or more times until the read pattern is determined to be not equal to the write pattern. The write pattern and the read pattern not being equal indicates the second voltage margin. Thus, the preceding voltage value where the read pattern did match the write pattern, or the penultimate voltage value, is the second voltage margin. The second voltage margin may be the lower voltage limit. When the write pattern is determined to not equal the read pattern, the methods 400 and 450 proceed to operation 430.

In operation 430, the first and second voltage margins of the data storage device are recorded.

FIG. 4C illustrates a graph of the first and second voltage margins. As show in FIG. 4C, the initial value of the reference voltage is one half of the supply or input/output voltage (VREF=VCCQ/2), and is illustrated as being about halfway up the x-axis. The first voltage margin, such as the first voltage margin recorded in operation 424 of methods 400 and methods 450, is denoted as $VREF+V_{threshold}$, and illustrates the upper voltage margin of the data storage system. $VREF+V_{threshold}$ is the voltage value preceding the last incremented voltage level where the read pattern was found to not match the write pattern in operation 424. The second voltage margin, such as the second voltage margin recorded in operation 428 of methods 400 and methods 450, is denoted as $VREF-V_{threshold}$, and illustrates the lower voltage margin of the data storage system. $VREF-V_{threshold}$ is the voltage value preceding the last decremented voltage level where the read pattern was found not to match the write pattern in operation 428. Thus, the valid voltage margins span the area of $VREF-V_{threshold}$ to $VREF+V_{threshold}$. A voltage input greater than the $VREF+V_{threshold}$ is detected as a logic '1', and a voltage input less than the $VREF-V_{threshold}$ is detected as a logic '0'.

By utilizing the automated methods 400 and 450, the voltage margins of the data storage device may be measured without physical intervention from a user. The automated methods 400 and 450 may further result in better setup and hold margins, and reduce the time required to measure the voltage margins.

Figure 5:
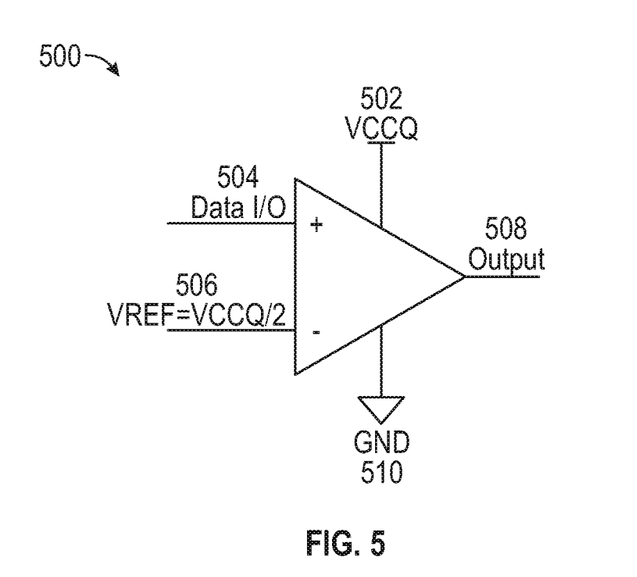
FIG. 5 illustrates a differential receiver, according to one embodiment.

FIG. 5 illustrates a differential receiver 500, according to one embodiment. The differential receiver 500 may be the differential receiver 118 of FIG. 1. The differential receiver 500 may be used when measuring the voltage margins, and may be utilized in methods 400 and 450. In at least one implementation, the differential receiver 500 is integrated into a controller, such as controller 108 of FIG. 1.

The differential receiver 500 receives an input/out or supply voltage (VCCQ) 502. The differential receiver 500 has a data input/output (I/O) 504 as a first input, and a reference voltage 506 as a second input. The data I/O 504 may be the positive input terminal while the reference voltage 506 may be the negative input terminal. The reference voltage 506 equals one half of the I/O voltage 502. The data I/O 504 will detect an input as a logic '1' if the voltage at the data I/O 504 is greater than the $VREF+V_{threshold}$, and will detect a logic '0' if the voltage at the data I/O 504 is less than the $VREF-V_{threshold}$, as shown in the graph of FIG. 4C. The differential receiver 500 further has a first output 508 to one or more memory devices, such as NAND memory devices, and is grounded 510.

The reference voltage 506 may be supplied internally or externally, and may use a resistor divider network to derive the reference voltage 506. A voltage at the reference voltage 506 input of the differential receiver 500 sets the bias condition for proper operation of one or more transistors, such as nMOSFET and pMOSFET transistors, which may be coupled to the differential receiver 500 in a circuit. The differential receiver 500 is configured to accept a range of voltages at the reference voltage 506 input, however, a voltage exceeding the designed range may cause a logic failure. To avoid a logic failure, the differential receiver 500 may have self-biasing capability.

By using automated methods to measure the voltage and timing margins, the voltage and timing margins of the data storage device may be measured without physical intervention from a user. Since the methods are automated and do not require physical intervention by a user, the time required to measure the timing and voltage margins is reduced, and better setup and hold margins can be achieved. Additionally, the automated methods of measuring the timing and voltage margins permit the margins to be measured more frequently for increased operation accuracy, which allows the changing process, temperature, and voltage conditions to be taken into consideration.

In one embodiment, a method for measuring timing margins of a storage device during a write operation comprises varying a delay of a data strobe signal by an interval across a width of a data window using a delay locked loop circuit, wherein the interval is less than a width of the data window, and determining one or more valid timing margins based on each varied interval of the delayed data strobe.

The method may further comprise determining, for each varied interval of the delayed data strobe, a write pattern by writing a predefined pattern to a flash memory device of the storage device, and determining, for each varied interval of the delayed data strobe, a read pattern by reading the predefined pattern from the flash memory device. The method may further comprise comparing, for each varied interval of the delayed data strobe, the write pattern to the read pattern. The one or more valid timing margin may occur at each varied interval of the delay of the data strobe signal where the write pattern was determined to be equal to the read pattern.

The interval may be varied by $\frac{1}{10}^{th}$ of the width of the data window. The writing of the predefined pattern may occur at a first speed, and the reading of the predefined pattern may occur at a second speed. The second speed may be greater than the first speed, and the second speed may be equal to a product power on reset data rate speed. The varying the delay of a data strobe signal by the interval may comprise aligning the data strobe signal at an initial interval of the data window, and incrementing the data strobe signal by the interval one or more times until the data strobe signal has been delayed across the width of the data window.

In one embodiment, a data storage device comprises one or more memory devices and a controller coupled to the one or more memory devices. The controller is configured to align a data strobe signal with an edge of a data window, delay the data strobe signal by one or more intervals along the data window using a delay locked loop circuit, and quantify one or more timing margins of the data window based on the delay of the data strobe signal.

The controller may be further configured to read a predefined data pattern from the one or more memory devices at each of the one or more intervals of the delayed data strobe signal. The one or more timing margins may be based on the read of the predefined data pattern at each of the one or more intervals of the delayed data strobe signal. The controller is further configured to measure one or more voltage margins.

In another embodiment, a data storage device comprises one or more flash memory devices, a memory interface coupled to the one or more flash memory devices, and a controller coupled to the memory interface and to the one or more flash memory devices. The controller is configured to apply a reference voltage to the memory interface at an initial value. The controller is further configured to determine a first margin of the reference voltage by incrementing the initial value of the reference voltage by a first voltage amount, and determine a second margin of the reference voltage by resetting the reference voltage to the initial value and decrementing the reference voltage by a second voltage amount.

The initial value of the reference voltage may be equal to one half of a supply voltage. The controller may be further configured to determine one or more timing margins of one or more data signals. The controller may be further configured to determine the first margin of the reference voltage by determining a write pattern, determining a read pattern, comparing the write pattern to the read pattern, and recording a first margin of the reference voltage when the write pattern does not equal the read pattern. The controller may be further configured to determine the second margin of the reference voltage by determining the write pattern, determining the read pattern, comparing the write pattern to the read pattern, and recording a second margin of the reference voltage when the write pattern does not equal the read pattern.

Determining the write pattern may comprise writing a predetermined pattern from a first memory device of the one or more flash memory devices at a first speed. Determining the read pattern may comprise reading the predetermined pattern from the first memory device at a second speed. The second speed may be equal to the first speed. The first speed and the second speed may be equal to a product power on reset data rate speed. The first voltage amount may be incremented by 50 mV. The second voltage amount may be decremented by 50 mV.

In one embodiment, a method for measuring a voltage margin of a data storage device during a read operation comprises applying a reference voltage to a host interface of the data storage device at an initial value and determining a first margin of the reference voltage. The determining of a first margin comprises incrementing the reference voltage at the host interface one or more times by a first voltage amount, comparing a write pattern to a read pattern, and recording the first margin of the reference voltage when the write pattern does not equal the read pattern. The method further comprises determining a second margin of the reference voltage. The determining of the second margin comprises resetting the reference voltage to the initial value, decrementing the reference voltage at the host interface one or more times by a second voltage amount, and recording the second margin of the reference voltage when the write pattern does not equal the read pattern.

Determining the first margin of the reference voltage may further comprise writing a predetermined pattern from a NAND flash memory device at a first speed, and reading the predetermined pattern from the NAND flash memory device at a second speed, the second speed being faster than the first speed. Determining the second margin may further comprise writing the predetermined pattern from a NAND flash memory device, and reading the predetermined pattern from the NAND flash memory device. One or more data strobe signals of the data storage device may be set to an initial interval along a data window when the reference voltage is applied.

The method may further comprise determining one or more margins of a timing delay of one or more data strobe signals. The determining of one or more margins of a timing delay of the one or more data strobe signals may comprise incrementing the one or more data strobe signals by a first interval along the data window, writing the predetermined pattern from the NAND flash memory device, reading the predetermined pattern from the NAND flash memory device, comparing a write pattern to a read pattern, and recording a first margin of the timing delay when the write pattern does not equal the read pattern.

The determining of one or more margins of a timing delay of the one or more data strobe signals may further comprise resetting the one or more data strobe signals to the initial interval of the data window, decrementing the one or more data strobe signals by a second interval along a data window, writing the predetermined pattern from the NAND flash memory device, reading the predetermined pattern from the NAND flash memory device, comparing a write pattern to a read pattern, and recording a second margin of the timing delay when the write pattern does not equal the read pattern. The first interval and the second interval may be the same.

In another embodiment, a storage device comprises one or more memory devices, means for varying a delay of a data strobe signal across a plurality of intervals of a data window, means for determining one or more timing margins, and means for determining one or more voltage margins.

The plurality of intervals may each equal 0.1 unit interval. The means for determining the one or more voltage margins may comprise determining the one or more voltage margins during write operations and during read operations. Determining the one or more voltage margins during read operations may comprise applying a reference voltage to a host interface. Determining the one or more voltage margins during write operations may comprise applying a reference voltage to a memory interface. The memory interface may be coupled to the one or more memory devices.

While the foregoing is directed to embodiments of the present disclosure, other and further embodiments of the disclosure may be devised without departing from the basic scope thereof, and the scope thereof is determined by the claims that follow.

What is claimed is:

1. A method for measuring timing margins used during write operations of a storage device, comprising:

varying a delay of a data strobe signal by an interval across a width of a data window using a delay locked loop circuit, wherein the interval is less than a width of the data window;
writing a predefined pattern to a memory device for each varied interval of the delayed data strobe;
reading the predefined pattern from the memory device for each varied interval of the delayed data strobe; and
determining one or more valid timing margins based on each varied interval of the delayed data strobe.

2. The method of claim 1, further comprising:
determining, for each varied interval of the delayed data strobe, a write pattern by writing a predefined pattern to a flash memory device of the storage device; and
determining, for each varied interval of the delayed data strobe, a read pattern by reading the predefined pattern from the flash memory device.

3. The method of claim 2, further comprising:
comparing, for each varied interval of the delayed data strobe, the write pattern to the read pattern; and
wherein the one or more valid timing margin occur at each varied interval of the delay of the data strobe signal where the write pattern was determined to be equal to the read pattern.

4. The method of claim 3, wherein the writing of the predefined pattern occurs at a first speed, and the reading of the predefined pattern occurs at a second speed.

5. The method of claim 4, wherein the second speed is greater than the first speed, and the second speed is equal to a maximum power speed.

6. The method of claim 1, wherein the interval is varied by 1/10th of the width of the data window.

7. The method of claim 1, wherein the varying the delay of a data strobe signal by the interval comprises:
aligning the data strobe signal at an initial interval of the data window; and
incrementing the data strobe signal by the interval one or more times until the data strobe signal has been delayed across the width of the data window.

8. A data storage device, comprising:
one or more memory devices; and
a controller coupled to the one or more memory devices, wherein the controller is configured to:
align a data strobe signal with an edge of a data window;
delay the data strobe signal by one or more intervals along the data window using a delay locked loop circuit
vary a read data rate for reading a predefined pattern from the one or more memory devices; and
quantify one or more timing margins of the data window based on the delay of the data strobe signal.

9. The data storage device of claim 8, wherein the controller is further configured to read a predefined data pattern from the one or more memory devices at each of the one or more intervals of the delayed data strobe signal.

10. The data storage device of claim 9, wherein the one or more timing margins are based on the read of the predefined data pattern at each of the one or more intervals of the delayed data strobe signal.

11. The data storage device of claim 8, wherein the controller is further configured to measure one or more voltage margins.

12. A data storage device, comprising:
one or more flash memory devices;
a memory interface coupled to the one or more flash memory devices; and
a controller coupled to the memory interface and to the one or more flash memory devices, wherein the controller is configured to:
apply a reference voltage to the memory interface at an initial value;
determine a first margin of the reference voltage by incrementing the initial value of the reference voltage by a first voltage amount until a write pattern does not equal a read pattern; and
determine a second margin of the reference voltage by resetting the reference voltage to the initial value and decrementing the reference voltage by a second voltage amount until the write pattern does not equal the read pattern.

13. The data storage device of claim 12, wherein the initial value of the reference voltage is equal to one half of a supply voltage.

14. The data storage device of claim 12, wherein the controller is further configured to determine one or more timing margins of one or more data signals.

15. The data storage device of claim 12, wherein the controller is further configured to determine a first margin of the reference voltage by determining a write pattern, determining a read pattern, comparing the write pattern to the read pattern, and recording the first margin of the reference voltage when the write pattern does not equal the read pattern.

16. The data storage device of claim 15, wherein the controller is further configured to determine a second margin of the reference voltage by determining the write pattern, determining the read pattern, comparing the write pattern to the read pattern, and recording the second margin of the reference voltage when the write pattern does not equal the read pattern.

17. The data storage device of claim 16, wherein determining the write pattern comprises writing a predetermined pattern from a first memory device of the one or more flash memory devices at a first speed, and wherein determining the read pattern comprises reading the predetermined pattern from the first memory device at a second speed.

18. The data storage device of claim 12, wherein the first voltage amount is incremented by 50 mV.

19. The data storage device of claim 12, wherein the second voltage amount is decremented by 50 mV.

20. A method for measuring a voltage margin of a data storage device during a read operation, comprising:
applying a reference voltage to a host interface of the data storage device at an initial value;
determining a first margin of the reference voltage, wherein determining the first margin comprises:
incrementing the reference voltage at a host interface one or more times by a first voltage amount;
comparing a write pattern to a read pattern; and
recording the first margin of the reference voltage when the write pattern does not equal the read pattern; and
determining a second margin of the reference voltage, wherein determining the second margin comprises:
resetting the reference voltage to the initial value;
decrementing the reference voltage at the host interface one or more times by a second voltage amount;
comparing a write pattern to a read pattern; and
recording the second margin of the reference voltage when the write pattern does not equal the read pattern.

21. The method of claim 20, wherein determining the first margin of the reference voltage comprises:

writing a predetermined pattern from a NAND flash memory device at a first speed; and reading the predetermined pattern from the NAND flash memory device at a second speed, the second speed being faster than the first speed.

22. The method of claim 21, wherein determining the second margin comprises:

writing the predetermined pattern from a NAND flash memory device; and reading the predetermined pattern from the NAND flash memory device.

23. The method of claim 20, wherein one or more data strobe signals of the data storage device are set to an initial interval along a data window when the reference voltage is applied.

24. The method of claim 23, further comprising determining one or more margins of a timing delay of one or more data strobe signals.

25. The method of claim 24, wherein the determining of one or more margins of a timing delay of the one or more data strobe signals comprises:

incrementing the one or more data strobe signals by a first interval along the data window;

writing a predetermined pattern from a NAND flash memory device;

reading the predetermined pattern from the NAND flash memory device;

comparing a write pattern to a read pattern; and recording a first margin of the timing delay when the write pattern does not equal the read pattern.

26. The method of claim 25, wherein the determining of one or more margins of a timing delay of the one or more data strobe signals further comprises:

resetting the one or more data strobe signals to the initial interval of the data window;

decrementing the one or more data strobe signals by a second interval along a data window;

writing the predetermined pattern from the NAND flash memory device;

reading the predetermined pattern from the NAND flash memory device;

comparing a write pattern to a read pattern; and recording a second margin of the timing delay when the write pattern does not equal the read pattern.

27. A storage device, comprising:

one or more memory devices;

means for varying a delay of a data strobe signal across a plurality of intervals of a data window;

means for determining one or more timing margins of read operations and write operations; and means for determining one or more voltage margins, the means for determining the one or more voltage margins configured to:

record one or more timing margins;

reset to an initial configuration;

increment a reference voltage until a write pattern does not equal a read pattern; and decrement the reference voltage until the write pattern does not equal the read pattern, and record one or more voltage margins.

28. The storage device of claim 27, wherein the plurality of intervals each equals 0.1 unit interval.

29. The storage device of claim 27, wherein the means for determining the one or more voltage margins comprises determining the one or more voltage margins during write operations and during read operations.

30. The storage device of claim 29, wherein determining the one or more voltage margins during read operations comprises applying a reference voltage to a host interface, and wherein determining the one or more voltage margins during write operations comprises applying a reference voltage to a memory interface, wherein the memory interface is coupled to the one or more memory devices.

* * * * *